(12) United States Patent
Kim

(10) Patent No.: US 8,330,527 B2
(45) Date of Patent: Dec. 11, 2012

(54) FUSE CIRCUIT OF SEMICONDUCTOR APPARATUS

(75) Inventor: Hong Gyeom Kim, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 105 days.

(21) Appl. No.: 12/949,064

(22) Filed: Nov. 18, 2010

(65) Prior Publication Data

US 2011/0291744 A1    Dec. 1, 2011

(30) Foreign Application Priority Data

May 31, 2010    (KR) .................. 10-2010-0051367

(51) Int. Cl.
*H01H 37/76*    (2006.01)
(52) U.S. Cl. ........................................ 327/525
(58) Field of Classification Search .............. 327/390, 327/524, 525
See application file for complete search history.

(56) References Cited

U.S. PATENT DOCUMENTS

| | | | | |
|---|---|---|---|---|
| 5,844,298 | A * | 12/1998 | Smith et al. ................. | 257/530 |
| 5,896,041 | A * | 4/1999 | Sher et al. ................... | 326/38 |
| 6,255,893 | B1 * | 7/2001 | Dishongh et al. ............ | 327/525 |
| 6,680,873 | B2 * | 1/2004 | Muraoka et al. ............. | 365/225.7 |
| 7,242,239 | B2 * | 7/2007 | Hanson et al. ............... | 327/525 |
| 7,620,838 | B2 | 11/2009 | Koba et al. | |
| 7,701,226 | B2 * | 4/2010 | Kaneko ....................... | 324/550 |
| 2007/0063312 | A1 | 3/2007 | Takemoto | |
| 2007/0171691 | A1 | 7/2007 | Ashizawa | |
| 2007/0262414 | A1 | 11/2007 | Ueda | |

FOREIGN PATENT DOCUMENTS

| | | |
|---|---|---|
| JP | 2000-133717 | 5/2000 |
| JP | 2000-299383 | 10/2000 |
| JP | 2004-013930 | 1/2004 |
| KR | 1020030024921 A | 3/2003 |
| KR | 1020090128175 A | 12/2009 |

* cited by examiner

*Primary Examiner* — Jeffrey Zweizig
(74) *Attorney, Agent, or Firm* — William Park & Associates Ltd.

(57) ABSTRACT

Various embodiments of a fuse circuit of a semiconductor apparatus are disclosed. In one exemplary embodiment, the fuse circuit may include a fuse whose electrical connection state can be changed by an electrical stress applied thereto and a plurality of self boosting units configured to perform self boosting operations under the control of a rupture enable signal. The self boosting units may also be configured to generate stress voltages and supply the generated stress voltages to the fuse. The fuse circuit may also include a precharge unit configured to supply a precharge voltage to the fuse in response to a precharge signal and a cross-coupled latching amplification unit configured to sense a change in a voltage level of the precharge voltage supplied to the fuse, with reference to a reference voltage, and output a fuse state signal.

45 Claims, 7 Drawing Sheets

FIG.1
(PRIOR ART)
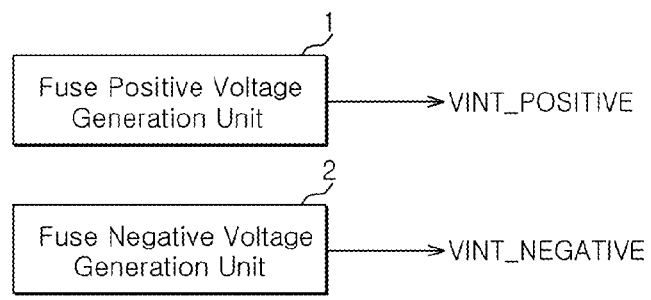
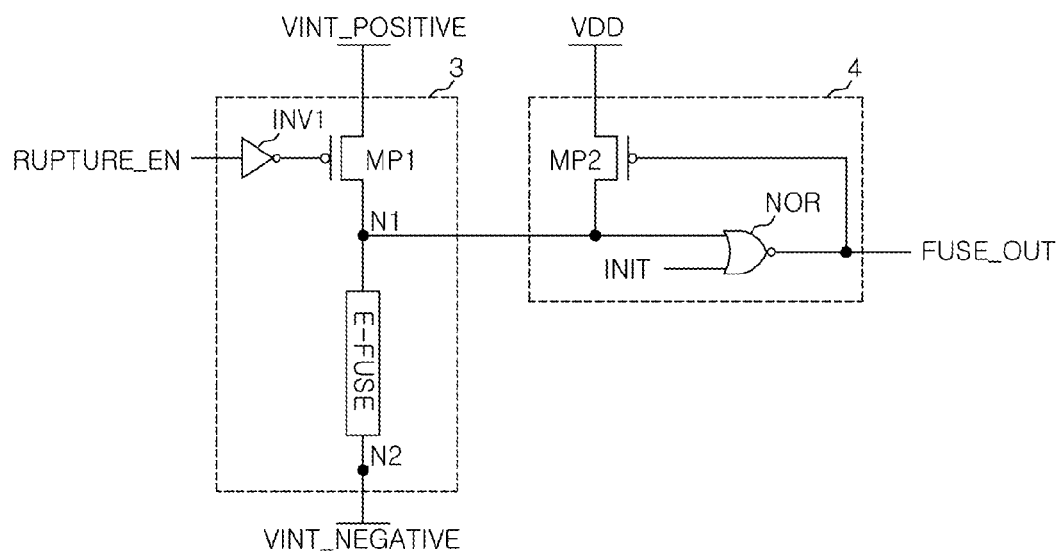

FUSE CIRCUIT OF SEMICONDUCTOR APPARATUS

CROSS-REFERENCE TO RELATED APPLICATION

The present application claims priority under 35 U.S.C. §119(a) to Korean Patent Application No. 10-2010-0051367, filed on May 31, 2010, in the Korean Intellectual Property Office, which is incorporated herein by reference in its entirety as if set forth in full.

BACKGROUND

1. Technical Field

Various embodiments of the present invention relate to a semiconductor apparatus, and more particularly, to a technology for configuring a fuse circuit.

2. Related Art

A semiconductor apparatus and a semiconductor memory apparatus have fuse circuits for changing internal settings or is programming repair addresses, etc. Fuses included in the fuse circuits may store addresses and/or specified setting information through fuse programming. The electrical connection characteristic of a fuse may change when a laser beam or an electrical stress is applied to the fuse, which may in turn change the electrical resistance value of the fuse. Using changes in the fuse's electrical connection state, the fuse circuit may program specific information.

FIG. 1 is a schematic diagram illustrating a configuration of a conventional fuse circuit of a semiconductor apparatus. As shown in FIG. 1, a conventional fuse circuit of a semiconductor apparatus includes a fuse positive voltage generation unit 1, a fuse negative voltage generation unit 2, a fuse stress voltage driving unit 3, and a fuse state output unit 4.

The fuse positive voltage generation unit 1 performs a charge pumping to generate a positive voltage VINT_POSITIVE, which is higher than a power supply voltage, while the fuse negative voltage generation unit 2 performs a charge pumping to generate a negative voltage VINT_NEGATIVE, which is lower than a ground voltage.

The fuse stress voltage driving unit 3 supplies the positive voltage VINT_POSITIVE and the negative voltage VINT_NEGATIVE to terminals N1 and N2 of a fuse E-FUSE, respectively, under the control of a rupture enable signal RUPTURE_EN. When the positive voltage VINT_POSITIVE and the negative voltage VINT_NEGATIVE are applied to fuse E-FUSE, the electrical connection state in fuse E-FUSE changes due to the applied electrical stress. For example, fuse E-FUSE could have a high resistance value before the electrical stress is applied and a low resistance value after the electrical stress is applied.

The fuse state output unit 4 senses the electrical connection state of fuse E-FUSE and outputs a fuse state signal FUSE_OUT. The fuse state output unit 4 latches the fuse state signal FUSE_OUT under the control of an initialization signal INIT.

As described above, the conventional fuse circuit uses both of the fuse positive voltage generation unit 1 and the fuse negative voltage generation unit 2 to generate fuse stress voltages. The fuse positive voltage generation unit 1 and the fuse negative voltage generation unit 2, however, occupy a significant layout space since each of them includes an oscillator, a charge pumping circuit, and a voltage stabilization circuit. In addition, power transmission lines need to be additionally provided to transmit the generated fuse stress voltages. Moreover, the power transmission lines occupy substantially large layout areas so as to prevent power loss.

Further, the fuse state output unit 4 has a fixed sensing sensitivity without the ability to control the sensing sensitivity.

SUMMARY

Accordingly, there is a need for an improved fuse circuit is that may obviate one or more of the above-mentioned problems or disadvantages. It should be understood, however, that some aspects of the present invention may not necessarily obviate one or more of those problems or disadvantages.

In the following description, certain aspects and embodiments will become evident. It should be understood that these aspects and embodiments are merely exemplary, and the invention, in its broadest sense, could be practiced without having one or more features of these aspects and embodiments.

To attain the advantages and in accordance with the purpose of the invention, as embodied and broadly described herein, one aspect of the invention may provide a circuit for driving stress voltages to a fuse and changing an electrical connection state of the fuse. The circuit may include a plurality of self boosting units configured to perform self boosting operations, generate stress voltages, and supply the generated stress voltages to the fuse.

According to another exemplary aspect of the present invention, a circuit for driving stress voltages to a fuse and changing an electrical connection state of the fuse may include: a voltage supply unit configured to supply a first stress voltage to one end of the fuse under the control of a rupture enable signal; and a self boosting unit configured to perform a self boosting operation under the control of the rupture enable signal, generate a second stress voltage, and supply the generated second stress voltage to the other end of the fuse.

In another exemplary aspect, a fuse state output circuit may include: a fuse whose electrical connection state is configured to be changed by an electrical stress; a precharge unit configured to supply a precharge voltage to the fuse in response to a precharge signal; and an amplification unit configured to sense a change in a voltage level of the precharge voltage supplied to the fuse, with reference to a reference voltage, and output a fuse state signal. In some exemplary embodiments, the amplification unit may comprise a cross-coupled latching amplification unit.

In still another exemplary aspect, a fuse state output circuit may include: a fuse whose electrical connection state is configured to be changed by an electrical stress; a precharge unit configured to supply a precharge voltage to the fuse during an activation interval of a precharge signal; and an amplification unit configured to sense a change in a voltage level of the precharge voltage supplied to the fuse, with reference to a reference voltage in response to a sensing enable pulse signal which is activated after a deactivation timing of the precharge signal, and latch a sensing result in response to a latch enable pulse signal. The amplification unit, according to one exemplary embodiment, may be a cross-coupled latching amplification unit.

Still another exemplary aspect of the present invention may provide a fuse circuit of a semiconductor apparatus, which comprises: a fuse whose electrical connection state is configured to be changed by an electrical stress; a plurality of self boosting units configured to perform self boosting operations under the control of a rupture enable signal, generate stress voltages, and supply the generated stress voltages to the fuse; a precharge unit configured to supply a precharge voltage to the fuse in response to a precharge signal; and an amplification unit, such as a cross-coupled latching amplification unit, configured to sense a change in a voltage level of the precharge voltage supplied to the fuse, with reference to a reference voltage, and output a fuse state signal.

According to one exemplary aspect, a fuse circuit of a semiconductor apparatus may include: a fuse whose electrical connection state is configured to be changed by an electrical stress; a plurality of self boosting units configured to perform self boosting operations under the control of a rupture enable signal, generate stress voltages, and supply the generated stress voltages to the fuse; a precharge unit configured to supply a precharge voltage to the fuse during an activation interval of a precharge signal; and an amplification unit (e.g., a cross-coupled latching amplification unit) configured to sense a change in a voltage level of the precharge voltage supplied to the fuse, with reference to a reference voltage in response to a sensing enable pulse signal which is activated after a is deactivation timing of the precharge signal, and latch a sensing result in response to a latch enable pulse signal.

In still another exemplary aspect, a fuse circuit of a semiconductor apparatus may include: a fuse whose electrical connection state is configured to be changed by an electrical stress; a voltage supply unit configured to supply a first stress voltage to one end of the fuse under the control of a rupture enable signal; a self boosting unit configured to perform a self boosting operation under the control of the rupture enable signal, generate a second stress voltage, and supply the generated second stress voltage to the other end of the fuse; a precharge unit configured to supply a precharge voltage to the fuse in response to a precharge signal; and an amplification unit (e.g., a cross-coupled latching amplification unit) configured to sense a change in a voltage level of the precharge voltage supplied to the fuse, with reference to a reference voltage, and output a fuse state signal.

According to another exemplary aspect, a fuse circuit of a semiconductor apparatus may include: a fuse whose electrical connection state is configured to be changed by an electrical stress; a voltage supply unit configured to supply a first stress voltage to one end of the fuse under the control of a rupture enable signal; a self boosting unit configured to perform a self boosting operation under the control of the rupture enable signal, generate a second stress voltage, and supply the generated second stress voltage to the other is end of the fuse; a precharge unit configured to supply a precharge voltage to the fuse during an activation interval of a precharge signal; and an amplification unit configured to sense a change in a voltage level of the precharge voltage supplied to the fuse, with reference to a reference voltage in response to a sensing enable pulse signal which is activated after a deactivation timing of the precharge signal, and latch a sensing result in response to a latch enable pulse signal. In one exemplary embodiment, the amplification unit may comprise a cross-coupled latching amplification unit.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

FIG. 1 is a schematic diagram illustrating an exemplary configuration of a conventional fuse circuit of a semiconductor apparatus.

DETAILED DESCRIPTION

Figure 2:
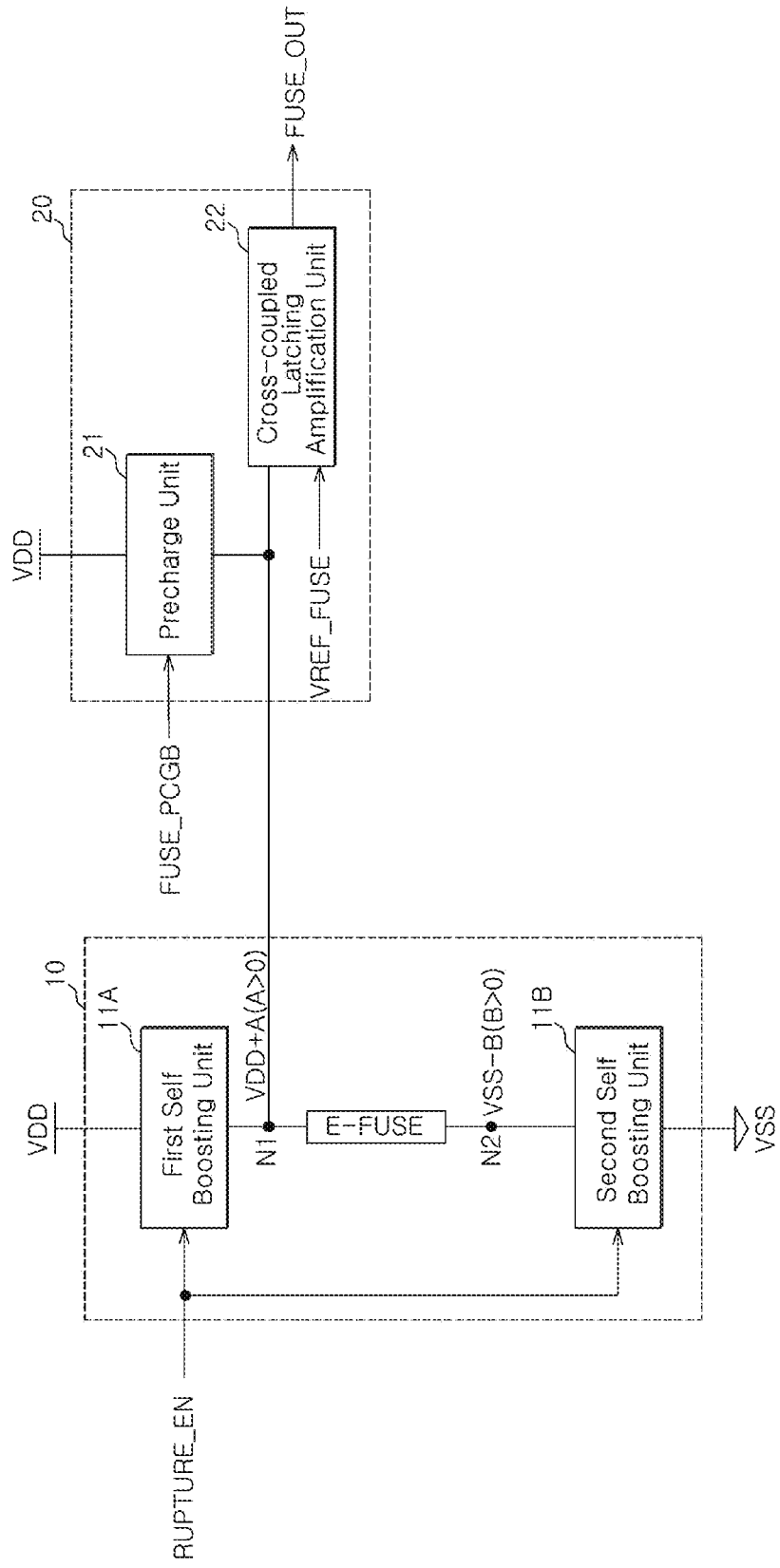
FIG. 2 is a schematic diagram illustrating an exemplary configuration of a fuse circuit of a semiconductor apparatus, consistent with an exemplary aspect of the present invention.

Reference will now be made in detail to the exemplary embodiments consistent with the present disclosure, examples of which are illustrated in the accompanying drawings. Wherever possible, the same reference characters will be used throughout the drawings to refer to the same or like parts.

It should be noted, however, that certain terms, symbols, and signs used to designate certain devices, blocks, and other multi-part elements in the present disclosure may also be used to designate sub-elements as the occasion demands. Thus, the same terms, symbols, and signs may not necessarily designate the same devices, blocks, and elements in the disclosed circuitry. In general, the values of a circuit's logic signals and binary data are termed as either a high level (H) or a low level (L) depending on their voltage levels and, at certain occasions, may be represented as '1' and '0'. Furthermore, as the occasion demands, they may be defined and/or described to have a high impedance state (a high-Z state).

FIG. 2 is a schematic diagram illustrating an exemplary configuration of a fuse circuit of a semiconductor apparatus, according to one exemplary aspect of the present invention. It should be noted that FIG. 2 depicts only a simplified configuration of an exemplary fuse circuit for purposes of providing more clearer explanation of the technical features contemplated by the present invention.

Referring to FIG. 2, a fuse circuit of a semiconductor apparatus includes a fuse stress voltage driving block 10 and a fuse state output block 20. Fuse stress voltage driving block 10 may include self boosting units 11A and 11B, and fuse state output block 20 may include a precharge unit 21 and a cross-coupled latching amplification unit 22.

The detailed configuration and principal operations of the fuse circuit of FIG. 2 will be described herein. A fuse E-FUSE changes its electrical connection state based on an electrical stress applied thereto. In this exemplary embodiment, the resistance value of fuse E-FUSE maintains a high value prior to an application of electrical stress, but changes to a low value when the electrical stress is applied, Self boosting units 11A and 11B perform self boosting operations under the control of a rupture enable signal RUPTURE_EN and generate stress voltages VDD+A and VSS−B. Self boosting units 11A and 11B also supply generated stress voltages VDD+A and VSS−B to fuse E-FUSE.

In the exemplary embodiment, self boosting units 11A and 11B include a first self boosting unit 11A and a second self boosting unit 11B. First self boosting unit 11A may be configured to boost a power supply voltage VDD under the control of rupture enable signal RUPTURE_EN, generate a first stress voltage VDD+A, which has a voltage level higher than power supply voltage VDD, and supply generated first stress voltage VDD+A to a first end N1 of fuse E-FUSE. First self boosting unit 11A may include a capacitor, which is coupled to first end N1 of fuse E-FUSE and is controlled by rupture enable signal RUPTURE_EN, and a diode, which is coupled between first end N1 of fuse E-FUSE and the terminal of power supply voltage VDD.

Second self boosting unit 11B may be configured to boost a ground voltage VSS under the control of rupture enable signal RUPTURE_EN, generate a second stress voltage VSS−B, which has a voltage level lower than ground voltage VSS, and supply generated second stress voltage VSS−B to a second end N2 of fuse E-FUSE. Second self boosting unit 11B may include a capacitor, which is coupled to second end N2 of fuse E-FUSE and controlled by rupture enable signal RUPTURE_EN, and a diode, which is coupled between second end N2 of fuse E-FUSE and the terminal of ground voltage VSS.

Precharge unit 21 of fuse state output block 20 may be configured to supply a precharge voltage VDD to first end N1 of fuse E-FUSE in response to a precharge signal FUSE_PCGB.

Before fuse E-FUSE is ruptured by stress voltages VDD+A and VSS-B, the potential of first end N1 of fuse E-FUSE maintains precharge voltage VDD. Also, after fuse E-FUSE is ruptured by stress voltages VDD+A and VSS−B, the potential of first end N1 of fuse E-FUSE becomes lower than precharge voltage VDD.

Cross-coupled latching amplification unit 22 of fuse state output block 20 may be configured to sense a change in the voltage level of precharge voltage VDD supplied to fuse E-FUSE, with reference to a reference voltage VREF_FUSE, and output a fuse state signal FUSE_OUT. For example, cross-coupled latching amplification unit 22 compares the potential of first end N1 of fuse E-FUSE to reference voltage VREF_FUSE, senses the electrical connection state of fuse E-FUSE, and output a sensing result as fuse state signal FUSE_OUT.

Although not shown in the drawings, the fuse circuit may further include a reference voltage output unit configured to output reference voltage VREF_FUSE in response to reference voltage select signals. The voltage level of reference voltage VREF_FUSE may be controlled by the reference voltage select signals. Cross-coupled latching amplification unit 22 may sense whether the potential of first end N1 of fuse E-FUSE is higher or lower than reference voltage VREF_FUSE and discriminate the electrical connection state of fuse E-FUSE depending upon the sensing result. Accordingly, if needed, the sensing sensitivity of cross-coupled latching amplification unit 22 may be controlled by controlling the voltage level of reference voltage VREF_FUSE.

Since the above-described fuse circuit generates stress voltages VDD+A and VSS−B through self boosting units 11A and 11B having simple logics, it provides advantages with respect to layout area utilization. Also, the application timings of first and second stress voltages VDD+A and VSS−B to first and second ends N1 and N2 of fuse E-FUSE under the control of rupture enable signal RUPTURE_EN can be controlled to be substantially the same with is each other. Accordingly, because the voltage difference between first end N1 and second end N2 of fuse E-FUSE instantaneously increases at the same timing, the electrical stress applied to fuse E-FUSE is increased. Consequently, the electrical connection state of fuse E-FUSE can be stably changed.

Figure 3:
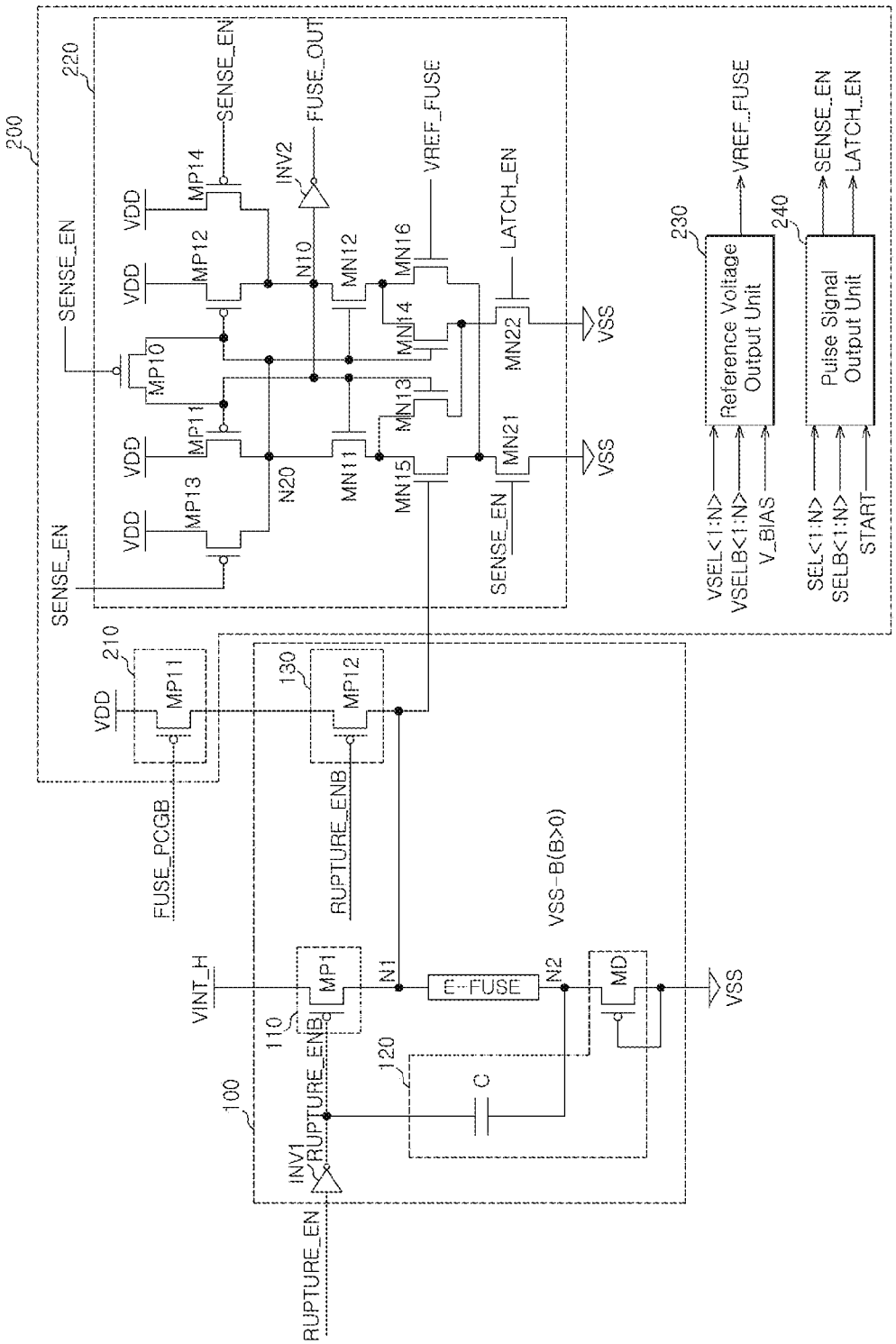
FIG. 3 is a schematic diagram illustrating a detailed configuration of the fuse circuit shown in FIG. 2.

FIG. 3 is a schematic diagram illustrating a detailed configuration of the exemplary fuse circuit shown in FIG. 2. Similar to FIG. 2, FIG. 3 also depicts only a simplified configuration of an exemplary fuse circuit to facilitate understanding of the technical features contemplated by the present embodiment.

Referring to FIG. 3, a fuse circuit of a semiconductor apparatus may include a fuse stress voltage driving block 100 and a fuse state output block 200. Fuse stress voltage driving block 100 may include a voltage supply unit 110, a self boosting unit 120, and a discharge unit 130. Further, fuse state output block 200 may include a precharge unit 210, a cross-coupled latching amplification unit 220, a reference voltage output unit 230, and a pulse signal output unit 240.

In some exemplary embodiments, discharge unit 130, reference voltage output unit 230, and pulse signal output unit 240 can be selectively included or excluded depending on the desired configuration of the fuse circuit.

The detailed configuration and principal operations of the fuse circuit of the embodiment shown in FIG. 3 will be described is below.

The electrical connection state of a fuse E-FUSE changes depending upon an electrical stress applied thereto. In one exemplary embodiment, fuse E-FUSE maintains a high resistance value before the electrical stress is applied, which changes to a low resistance value after the electrical stress is applied.

Voltage supply unit 110 may be configured to supply a first stress voltage VINT_H to first end N1 of fuse E-FUSE under the control of rupture enable signal RUPTURE_EN. First stress voltage VINT_H may have a voltage level higher than a power supply voltage VDD.

Self boosting unit 120 may be configured to perform a self boosting operation under the control of rupture enable signal RUPTURE_EN, generate a second stress voltage VSS−B, and supply the generated second stress voltage VSS−B to second end N2 of fuse E-FUSE. Thus, self boosting unit 120 boosts a ground voltage VSS under the control of rupture enable signal RUPTURE_EN and generates second stress voltage VSS−B, which has a voltage level lower than ground voltage VSS.

In the exemplary embodiment shown in FIG. 3, self boosting unit 120 is composed of a capacitor C and a diode MD. Capacitor C is coupled to second end N2 of fuse E-FUSE and is controlled by rupture enable signal RUPTURE_EN. Diode MD is is coupled between second end N2 of fuse E-FUSE and the terminal of ground voltage VSS. The voltage level of second end N2 of fuse E-FUSE is boosted to a negative voltage level according to a change in the voltage level of rupture enable signal RUPTURE_EN. While the diode MD is composed of a PMOS transistor in the present embodiment, the diode MD may be composed of an NMOS transistor.

The discharge unit 130 is configured to discharge first end N1 of fuse E-FUSE to the level of the power supply voltage VDD in response to rupture enable signal RUPTURE_ENB. Discharge unit 130 functions to discharge first end N1 of fuse E-FUSE to a level lower than first stress voltage VINT_H before applying again first stress voltage VINT_H to first end N1 of fuse E-FUSE when fuse E-FUSE is not completely ruptured by stress voltages.

First stress voltage VINT_H may be defined as a positive voltage having a voltage level higher than the power supply voltage VDD, and second stress voltage VSS−B may be defined as a negative voltage.

While, in the disclosed embodiment, the negative voltage generated by self-boosting ground voltage VSS is supplied to fuse E-FUSE, it should be understood that a negative voltage may be supplied to first end N1 of fuse E-FUSE, and the positive voltage generated by self-boosting power supply voltage VDD may be supplied to second end N2 of fuse E-FUSE.

Since the above-described fuse stress voltage driving block 100 generates the stress voltage through self boosting unit 120 having simple logics, it provides advantages with respect to layout area utilization. Furthermore, the application timings of first and second stress voltages VINT_H and VSS–B to first and second ends N1 and N2 of fuse E-FUSE under the control of rupture enable signal RUPTURE_EN can be controlled to be substantially the same with each other. Accordingly, because the voltage difference between first end N1 and second end N2 of fuse E-FUSE instantaneously increases at the same timing, the electrical stress applied to fuse E-FUSE is increased. Therefore, the electrical connection state of fuse E-FUSE can be stably changed.

Precharge unit 210 may be configured to supply a precharge voltage VDD to first end N1 of fuse E-FUSE in response to a precharge signal FUSE_PCGB. Before fuse E-FUSE is ruptured by stress voltages VINT_H and VSS–B, the potential of first end N1 of fuse E-FUSE maintains precharge voltage VDD. Also, after fuse E-FUSE is ruptured by stress voltages VINT_H and VSS–B, the potential of first end N1 of fuse E-FUSE becomes lower than precharge voltage VDD.

Cross-coupled latching amplification unit 220 may be configured to sense a change in the voltage level of precharge voltage VDD supplied to fuse E-FUSE, with reference to a reference voltage VREF_FUSE, and output a fuse state signal FUSE_OUT. For example, cross-coupled latching amplification unit 220 compares the potential of first end N1 of fuse E-FUSE to reference voltage VREF_FUSE, senses the electrical connection state of fuse E-FUSE, and output a sensing result as fuse state signal FUSE_OUT.

Cross-coupled latching amplification unit 220 senses a change in the voltage level of precharge voltage VDD supplied to fuse E-FUSE, with reference to reference voltage VREF_FUSE in response to a sensing enable pulse signal SENSE_EN. Sensing enable pulse signal SENSE_EN may be activated after the deactivation timing of precharge signal FUSE_PCGB. Cross-coupled latching amplification unit 220 then latches a sensing result in response to a latch enable pulse signal LATCH_EN.

Reference voltage output unit 230 may be configured to output reference voltage VREF_FUSE in response to reference voltage select signals VSEL<1:N> and VSELB<1:N>. The voltage level of reference voltage VREF_FUSE is controlled by reference voltage select signals VSEL<1:N> and VSELB<1:N>. Cross-coupled latching amplification unit 220 senses whether the potential of first end N1 of fuse E-FUSE is higher or lower than reference voltage VREF_FUSE, and discriminates the electrical connection state of fuse E-FUSE depending upon a sensing result. Accordingly, by controlling the voltage level of reference voltage VREF_FUSE, the sensing sensitivity of cross-coupled latching amplification unit 220 can be controlled as needed.

Pulse signal output unit 240 may be configured to output sensing enable pulse signal SENSE_EN and latch enable pulse signal LATCH_EN in response to pulse select signals SEL<1:N> and SELB<1:N>. The activation timings of sensing enable pulse signal SENSE_EN and latch enable pulse signal LATCH_EN are controlled by pulse select signals SEL<1:N> and SELB<1:N>. If precharge signal FUSE_PCGB is deactivated, the potential of first end N1 of fuse E-FUSE maintains, or falls below, a predetermined level depending upon the electrical connection state of fuse E-FUSE. When assuming that fuse E-FUSE is ruptured, the potential of first end N1 of fuse E-FUSE gradually falls. At this time, a sufficient time for allowing the potential of first end N1 of fuse E-FUSE to fall is required. Thus, as the activation timing of sensing enable pulse signal SENSE_EN for activating the sensing operation of cross-coupled latching amplification unit 220 becomes late, sensing sensitivity can be improved. Latch enable pulse signal LATCH_EN may then be activated later than the activation timing of sensing enable pulse signal SENSE_EN.

Figure 4:
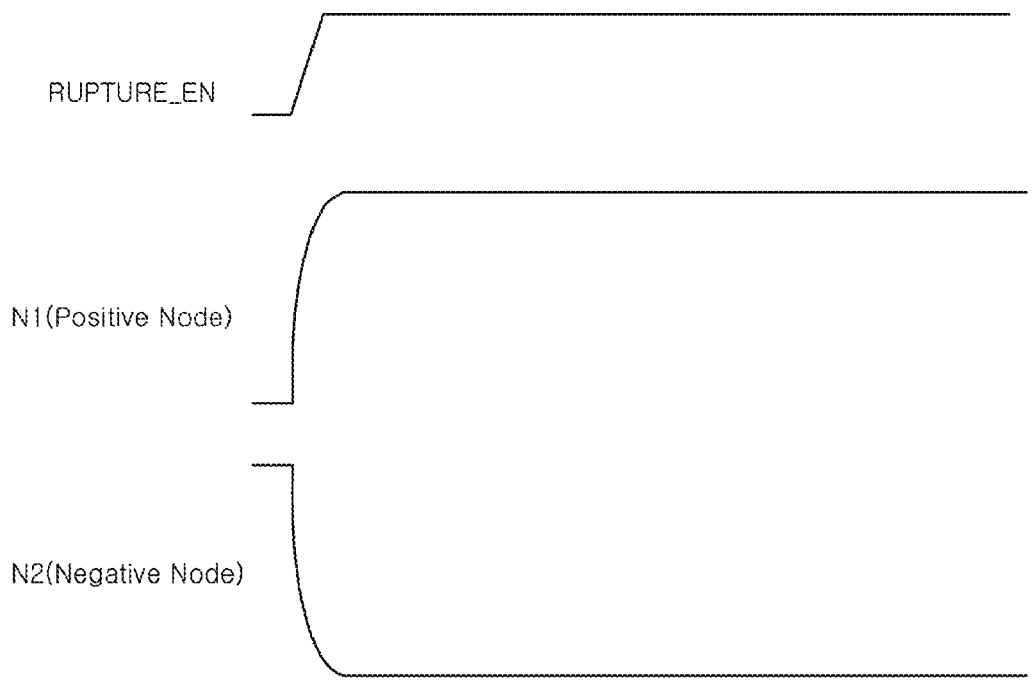
FIG. 4 is a schematic diagram illustrating exemplary stress voltages applied to a fuse.

FIG. 4 is a graph illustrating stress voltages applied to a fuse. As shown, if rupture enable signal RUPTURE_EN is activated to a high level, first end N1 of fuse E-FUSE abruptly rises to a positive voltage level, and second end N2 of fuse E-FUSE abruptly falls to a negative voltage level by self boosting. At this time, since the rising timing and the falling timing of the potentials of first end N1 and is second end N2 of fuse E-FUSE are controlled by rupture enable signal RUPTURE_EN to be substantially the same, the electrical stress applied to fuse E-FUSE is increased.

Figure 5:
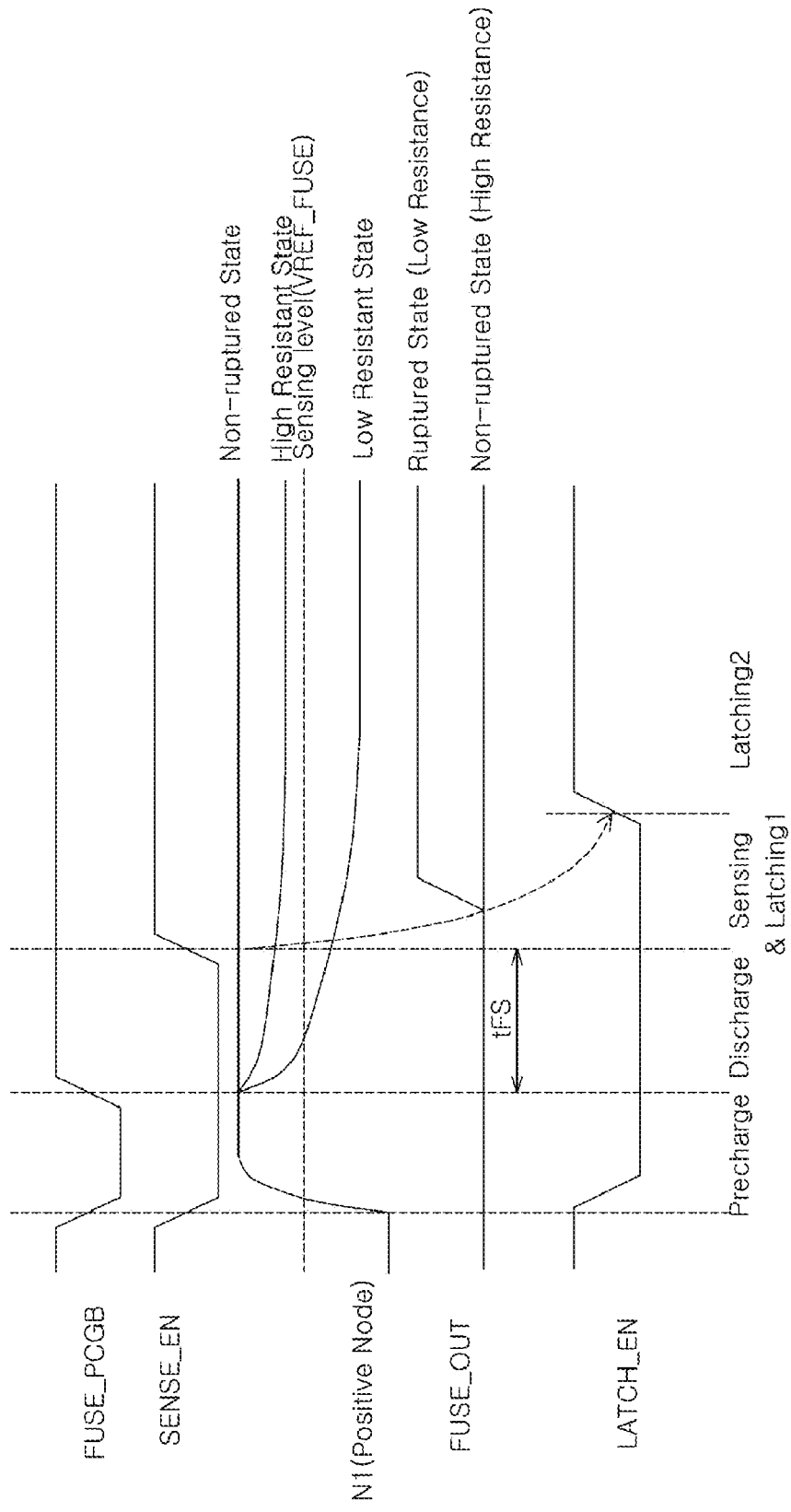
FIG. 5 is a timing diagram illustrating the internal operations of the fuse circuit shown in FIG. 3.

FIG. 5 is a timing diagram illustrating the internal operations of the fuse circuit of a semiconductor apparatus shown in FIG. 3. The internal operations of the fuse circuit of a semiconductor apparatus configured as mentioned above will be described below with reference to the timing diagram of FIG. 5 along with FIG. 3.

Since precharge voltage VDD is supplied to first end N1 of fuse E-FUSE during a time period in which precharge signal FUSE_PCGB is activated to a low level, first end N1 of fuse E-FUSE maintains precharge voltage VDD.

Next, during a predetermined time period tFS (i.e., from a first timing at which precharge signal FUSE_PCGB is deactivated to a high level to a second timing at which sensing enable pulse signal SENSE_EN is activated to a high level), the potential of first end N1 of fuse E-FUSE maintains the predetermined level or gradually falls depending upon the electrical connection state of fuse E-FUSE.

When sensing enable pulse signal SENSE_EN is activated to the high level, cross-coupled latching amplification unit 220 compares the potential of first end N1 of fuse E-FUSE to reference voltage VREF_FUSE, and outputs a sensing result as fuse state signal FUSE_OUT. If fuse E-FUSE is ruptured, fuse state signal FUSE_OUT is outputted to a high level. Conversely, if fuse E-FUSE is not ruptured, fuse state signal FUSE_OUT is outputted to a low level. Fuse state signal FUSE_OUT is latched when latch enable pulse signal LATCH_EN is activated to a high level.

Cross-coupled latching amplification unit 220 shown in FIG. 3 may be configured to simultaneously perform not only a sensing operation but also amplification and latching operations when sensing enable pulse signal SENSE_EN is activated. Cross-coupled latching amplification unit 220 may additionally perform amplification and latching operations when latch enable pulse signal LATCH_EN is activated. Since cross-coupled latching amplification unit 220 is composed of two-stepped amplification and latching stages, the amplification and latching operations can be precisely performed.

Figure 6:
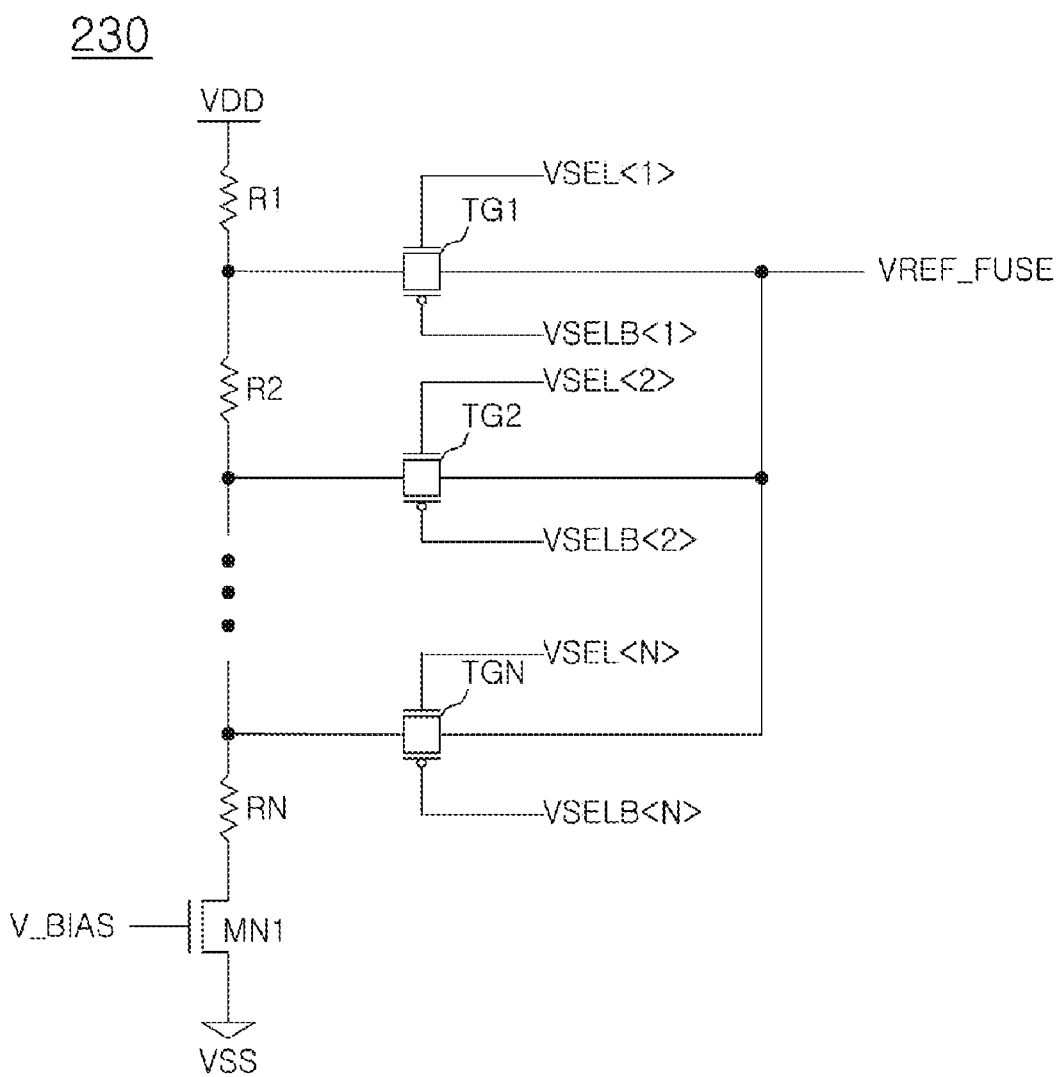
FIG. 6 is a schematic diagram illustrating an exemplary configuration of the reference voltage output unit shown in FIG. 3.

FIG. 6 is a schematic circuit diagram illustrating an exemplary configuration of the reference voltage output unit shown in FIG. 3. As shown in the figure, reference voltage output unit 230 may include a plurality of resistors R1 through RN disposed between the terminal of power supply voltage VDD and the terminal of ground voltage VSS. Reference voltage output unit 230 may also include a plurality of switching sections TG1 through TGN, which selectively output a plurality of distributed voltages as reference voltage VREF_FUSE. The plurality of distributed voltages are outputted at different voltage distribution ratios by the plurality of resistors R1 through RN. The plurality of switching sections TG1 through TGN are selectively turned on by reference voltage select signals VSEL<1:N> and VSELB<1:N>.

Figure 7:
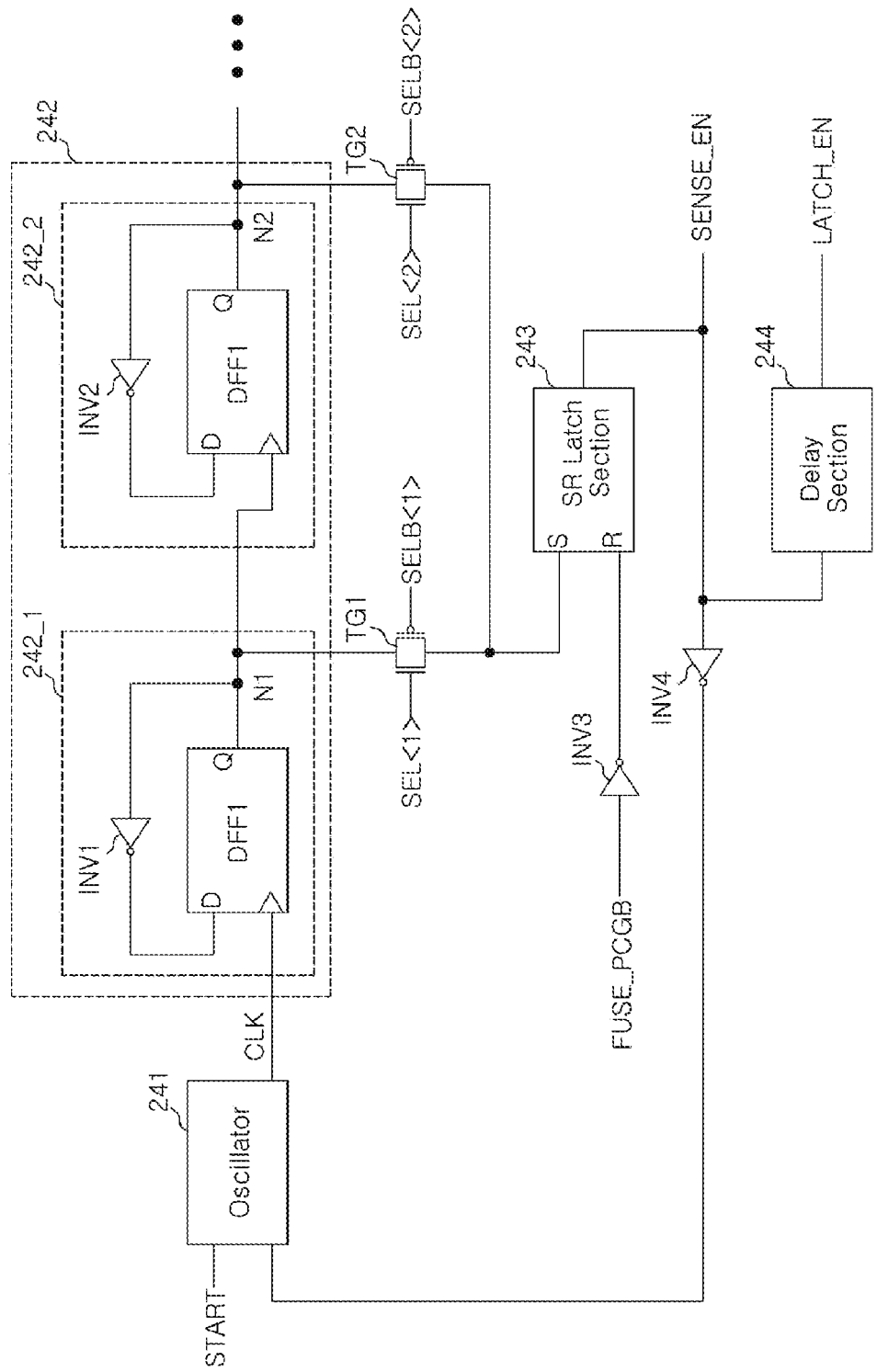
FIG. 7 is a schematic diagram illustrating an exemplary configuration of the pulse signal output unit shown in FIG. 3.

FIG. 7 is a schematic circuit diagram illustrating an exemplary configuration of pulse signal output unit 240 shown in FIG. 3. Referring to FIG. 7, pulse signal output unit 240 may include an oscillator 241, a plurality of flip-flops 242 (e.g., flip-flops 242_1 and 242_2), a plurality of switching sections TG1 and TG2, an SR latch section 243, and a delay section 244.

Oscillator 241 may be configured to output a periodic pulse signal having a predetermined period when a start signal START is activated.

The plurality of flip-flops 242_1 and 242_2 are connected in series and are configured to divide and output the periodic pulse signal which is outputted from oscillator 241.

The plurality of switching sections TG1 and TG2 may be configured to selectively output a plurality of divided periodic pulse signals, which are outputted from the plurality of flip-flops 242 under the control of pulse select signals SEL<1:N> and SELB<1:N>.

SR latch section 243 may be configured to output sensing enable pulse signal SENSE_EN, which has a pulsing timing corresponding to any one of the divided periodic pulse signals outputted from the plurality of switching sections TG1 and TG2 when precharge signal FUSE_PCGB is deactivated to the high level.

Delay section 244 may be configured to delay sensing enable pulse signal SENSE_EN by a preselected time and output latch enable pulse signal LATCH_EN.

As is apparent from the above description, the fuse state output circuit in accordance with various exemplary embodiments of the present invention may provide a fuse state output circuit capable of controlling sensing sensitivity. Further, the fuse circuit of a semiconductor apparatus, consistent with various embodiments of the present invention, can stably perform a fuse programming operation.

It should be noted that other embodiments encompassing additional elements that may not be directly associated with the technical features of the present invention may be contemplated in order to describe the present invention in further detail. Moreover, an active high configuration or an active low configuration for indicating the activated states of signals and circuits may vary depending upon a specific embodiment of the present invention.

Furthermore, the configurations of transistors may be varied as the occasion demands in order to realize the same function. For example, the configurations of a PMOS transistor and an NMOS transistor may be replaced with each other, and various types of transistors may be employed to accommodate a specific need and/or configuration.

Since there can be a large number of such variations, and is these variations can be easily inferred by those skilled in the art, the enumeration thereof will be omitted herein.

While certain embodiments have been described above, it will be understood to those skilled in the art that the embodiments described are by way of example only. Accordingly, the fuse circuit of a semiconductor apparatus described herein should not be limited based on the described embodiments. Rather, the fuse circuit of a semiconductor apparatus described herein should only be limited in light of the claims that follow when taken in conjunction with the above description and accompanying drawings.

What is claimed is:

1. A circuit for driving stress voltages to a fuse and changing an electrical connection state of the fuse, comprising:
    a first self boosting unit configured to boost a power supply voltage under the control of a rupture enable signal, generate a first stress voltage having a voltage level higher than the power supply voltage, and supply the generated first stress voltage to one end of is the fuse, comprising of a capacitor coupled to the one end of the fuse and configured to be controlled by the rupture enable signal, and a diode coupled between the one end of the fuse and a terminal of the power supply voltage; and
    a second self boosting unit configured to boost a ground voltage under the control of the rupture enable signal, generate a second stress voltage having a voltage level lower than the ground voltage, and supply the generated second stress voltage to the other end of the fuse.

2. The circuit according to claim 1, wherein the second self boosting unit comprises:
    a capacitor coupled to the other end of the fuse and configured to be controlled by the rupture enable signal; and
    a diode coupled between the other end of the fuse and a terminal of the ground voltage.

3. A circuit for driving stress voltages to a fuse and changing an electrical connection state of the fuse, comprising:
    a voltage supply unit configured to supply a first stress voltage to one end of the fuse under the control of a rupture enable signal; and
    a self boosting unit which is configured to boost a ground voltage under the control of the rupture enable signal, generate the second stress voltage having a voltage level lower than the ground voltage, and supply the generated second stress voltage to the other end of the fuse,
    wherein the self boosting unit further comprises:
    a capacitor coupled to the other end of the fuse and configured to be controlled by the rupture enable signal; and
    a diode coupled between the other end of the fuse and a terminal of the ground voltage.

4. The circuit according to claim 3, wherein the first stress voltage is a positive voltage having a voltage level higher than a is power supply voltage, and the second stress voltage is a negative voltage.

5. The circuit according to claim 3, wherein the self boosting unit is configured to boost a power supply voltage under the control of the rupture enable signal and generate the second stress voltage having a voltage level higher than the power supply voltage.

6. The circuit according to claim 5, wherein the self boosting unit comprises:
    a capacitor coupled to the other end of the fuse and configured to be controlled by the rupture enable signal; and
    a diode coupled between the other end of the fuse and a terminal of the power supply voltage.

7. The circuit according to claim 5, wherein the first stress voltage is a negative voltage having a voltage level lower than a ground voltage, and the second stress voltage is a positive voltage.

8. The circuit according to claim 3, further comprising a discharge unit configured to discharge the one end of the fuse in response to the rupture enable signal.

9. A fuse state output circuit comprising:
    a fuse whose electrical connection state is configured to be changed by an electrical stress;

a precharge unit configured to supply a precharge voltage to the fuse in response to a precharge signal; and an amplification unit configured to sense a change in a voltage level of the precharge voltage supplied to the fuse, with reference to a reference voltage, and output a fuse state signal, wherein the amplification unit further comprises a cross-coupled latching amplification unit.

10. The fuse state output circuit according to claim 9, further comprising a reference voltage output unit configured to output the reference voltage in response to reference voltage select signals, wherein a voltage level of the reference voltage is controlled according to the reference voltage select signals.

11. A fuse state output circuit comprising:
a fuse whose electrical connection state is configured to be changed by an electrical stress;
a precharge unit configured to supply a precharge voltage to the fuse during an activation interval of a precharge signal; and
an amplification unit configured to sense a change in a voltage level of the precharge voltage supplied to the fuse, with reference to a reference voltage, in response to a sensing enable pulse signal which is activated after a deactivation timing of the precharge signal, and latch a sensing result in response to a latch enable pulse signal.

12. The fuse state output circuit according to claim 11, wherein the amplification unit comprises a cross-coupled latching amplification unit.

13. The fuse state output circuit according to claim 11, further comprising a pulse signal output unit configured to output the sensing enable pulse signal and the latch enable pulse signal in response to pulse select signals, wherein activation timings of the sensing enable pulse signal and the latch enable pulse signal are controlled according to the pulse select signals.

14. A fuse circuit of a semiconductor apparatus, comprising:
a fuse whose electrical connection state is configured to be changed by an electrical stress;
a plurality of self boosting units configured to perform self boosting operations under the control of a rupture enable signal, generate stress voltages, and supply the generated stress voltages to the fuse;
a precharge unit configured to supply a precharge voltage to the fuse in response to a precharge signal; and
an amplification unit configured to sense a change in a voltage level of the precharge voltage supplied to the fuse, with reference to a reference voltage, and output a fuse state signal.

15. The fuse circuit according to claim 14, wherein the amplification unit comprises a cross-coupled latching amplification unit.

16. The fuse circuit according to claim 14, wherein the plurality of self boosting units comprise:
a first self boosting unit configured to boost a power supply voltage under the control of the rupture enable signal, generate a first stress voltage having a voltage level higher than the power supply voltage, and supply the generated first stress voltage to one end of the fuse; and
a second self boosting unit configured to boost a ground voltage under the control of the rupture enable signal, generate a is second stress voltage having a voltage level lower than the ground voltage, and supply the generated second stress voltage to the other end of the fuse.

17. The fuse circuit according to claim 16, wherein the first self boosting unit comprises:

a capacitor coupled to the one end of the fuse and configured to be controlled by the rupture enable signal; and
a diode coupled between the one end of the fuse and a terminal of the power supply voltage.

18. The fuse circuit according to claim 16, wherein the second self boosting unit comprises:
a capacitor coupled to the other end of the fuse and configured to be controlled by the rupture enable signal; and
a diode coupled between the other end of the fuse and a terminal of the ground voltage.

19. The fuse circuit according to claim 14, further comprising a reference voltage output unit configured to output the reference voltage in response to reference voltage select signals, wherein a voltage level of the reference voltage is controlled according to the is reference voltage select signals.

20. A fuse circuit of a semiconductor apparatus, comprising:
a fuse whose electrical connection state is configured to be changed by an electrical stress;
a plurality of self boosting units configured to perform self boosting operations under the control of a rupture enable signal, generate stress voltages, and supply the generated stress voltages to the fuse;
a precharge unit configured to supply a precharge voltage to the fuse during an activation interval of a precharge signal; and
an amplification unit configured to sense a change in a voltage level of the precharge voltage supplied to the fuse, with reference to a reference voltage in response to a sensing enable pulse signal which is activated after a deactivation timing of the precharge signal, and latch a sensing result in response to a latch enable pulse signal.

21. The fuse circuit according to claim 20, wherein the amplification unit comprises a cross-coupled latching amplification unit.

22. The fuse circuit according to claim 20, wherein the self boosting units comprise:
a first self boosting unit configured to boost a power supply voltage under the control of the rupture enable signal, generate a first stress voltage having a voltage level higher than the power supply voltage, and supply the generated first stress voltage to one end of the fuse; and
a second self boosting unit configured to boost a ground voltage under the control of the rupture enable signal, generate a second stress voltage having a voltage level lower than the ground voltage, and supply the generated second stress voltage to the other end of the fuse.

23. The fuse circuit according to claim 22, wherein the first self boosting unit comprises:
a capacitor coupled to the one end of the fuse and configured to be controlled by the rupture enable signal; and
a diode coupled between the one end of the fuse and a terminal of the power supply voltage.

24. The fuse circuit according to claim 22, wherein the second self boosting unit comprises:
a capacitor coupled to the other end of the fuse and configured to be controlled by the rupture enable signal; and
a diode coupled between the other end of the fuse and a terminal of the ground voltage.

25. The fuse circuit according to claim 20, further comprising a pulse signal output unit configured to output the sensing enable pulse signal and the latch enable pulse signal in response to pulse select signals, wherein activation timings of the sensing enable pulse signal and the latch enable pulse signal are controlled according to the pulse select signals.

26. A fuse circuit of a semiconductor apparatus, comprising:

a fuse whose electrical connection state is configured to be changed by an electrical stress;

a voltage supply unit configured to supply a first stress voltage to one end of the fuse under the control of a rupture enable signal;

a self boosting unit configured to perform a self boosting operation under the control of the rupture enable signal, generate a second stress voltage, and supply the generated second stress voltage to the other end of the fuse;

a precharge unit configured to supply a precharge voltage to the fuse in response to a precharge signal; and an amplification unit configured to sense a change in a voltage level of the precharge voltage supplied to the fuse, with reference to is a reference voltage, and output a fuse state signal.

27. The fuse circuit according to claim 26, wherein the amplification unit comprises a cross-coupled latching amplification unit.

28. The fuse circuit according to claim 26, wherein the self boosting unit is configured to boost a ground voltage under the control of the rupture enable signal and generate the second stress voltage having a voltage level lower than the ground voltage.

29. The fuse circuit according to claim 28, wherein the self boosting unit comprises:

a capacitor coupled to the other end of the fuse and configured to be controlled by the rupture enable signal; and a diode coupled between the other end of the fuse and a terminal of the ground voltage.

30. The fuse circuit according to claim 28, wherein the first stress voltage is a positive voltage having a voltage level higher than a power supply voltage, and the second stress voltage is a negative voltage.

31. The fuse circuit according to claim 26, wherein the self boosting unit is configured to boost a power supply voltage under the control of the rupture enable signal and generate the second stress voltage having a voltage level higher than the power supply voltage.

32. The fuse circuit according to claim 31, wherein the self boosting unit comprises:

a capacitor coupled to the other end of the fuse and configured to be controlled by the rupture enable signal; and a diode coupled between the other end of the fuse and a terminal of the power supply voltage.

33. The fuse circuit according to claim 31, wherein the first stress voltage is a negative voltage having a voltage level lower than a ground voltage, and the second stress voltage is a positive voltage.

34. The fuse circuit according to claim 26, further comprising:

a discharge unit configured to discharge the one end of the fuse in response to the rupture enable signal.

35. The fuse circuit according to claim 26, further comprising a reference voltage output unit configured to output the reference voltage in response to reference voltage select signals, wherein a voltage level of the reference voltage is controlled according to the reference voltage select signals.

36. A fuse circuit of a semiconductor apparatus, comprising:

a fuse whose electrical connection state is configured to be changed by an electrical stress;

a voltage supply unit configured to supply a first stress voltage to one end of the fuse under the control of a rupture enable signal;

a self boosting unit configured to perform a self boosting operation under the control of the rupture enable signal, generate a second stress voltage, and supply the generated second stress voltage to the other end of the fuse;

a precharge unit configured to supply a precharge voltage to the fuse during an activation interval of a precharge signal; and an amplification unit configured to sense a change in a voltage level of the precharge voltage supplied to the fuse, with reference to a reference voltage, in response to a sensing enable pulse signal which is activated after a deactivation timing of the precharge signal, and latch a sensing result in response to a latch enable pulse signal.

37. The fuse circuit according to claim 36, wherein the amplification unit comprises a cross-coupled latching amplification unit.

38. The fuse circuit according to claim 36, wherein the self boosting unit is configured to boost a ground voltage under the control of the rupture enable signal and generate the second stress voltage having a voltage level lower than the ground voltage.

39. The fuse circuit according to claim 38, wherein the self boosting unit comprises:

a capacitor coupled to the other end of the fuse and configured to be controlled by the rupture enable signal; and a diode coupled between the other end of the fuse and a terminal of the ground voltage.

40. The fuse circuit according to claim 38, wherein the first stress voltage is a positive voltage having a voltage level higher than a power supply voltage, and the second stress voltage is a negative voltage.

41. The fuse circuit according to claim 36, wherein the self boosting unit is configured to boost a power supply voltage under the is control of the rupture enable signal and generate the second stress voltage having a voltage level higher than the power supply voltage.

42. The fuse circuit according to claim 41, wherein the self boosting unit comprises:

a capacitor coupled to the other end of the fuse and configured to be controlled by the rupture enable signal; and a diode coupled between the other end of the fuse and a terminal of the power supply voltage.

43. The fuse circuit according to claim 41, wherein the first stress voltage is a negative voltage having a voltage level lower than a ground voltage, and the second stress voltage is a positive voltage.

44. The fuse circuit according to claim 36, further comprising a discharge unit configured to discharge the one end of the fuse in response to the rupture enable signal.

45. The fuse circuit according to claim 36, further comprising:

a pulse signal output unit configured to output the sensing enable pulse signal and the latch enable pulse signal in response to pulse select signals, wherein activation timings of the sensing enable pulse signal and the latch enable pulse signal are controlled according to the pulse select signals.

* * * * *